(12) United States Patent
Yajima

(10) Patent No.: US 11,410,979 B2
(45) Date of Patent: Aug. 9, 2022

(54) LIGHT-EMITTING ELEMENT, AND METHOD FOR PRODUCING A LIGHT-EMITTING ELEMENT

(71) Applicant: CANON KABUSHIKI KAISHA, Tokyo (JP)

(72) Inventor: Takahiro Yajima, Odawara (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 16/901,348

(22) Filed: Jun. 15, 2020

(65) Prior Publication Data

US 2020/0395351 A1 Dec. 17, 2020

(30) Foreign Application Priority Data

Jun. 17, 2019 (JP) .............................. JP2019-112140

(51) Int. Cl.
*H01L 25/18* (2006.01)

(52) U.S. Cl.
CPC ................................... *H01L 25/18* (2013.01)

(58) Field of Classification Search
CPC ....... H01L 23/552; H01L 25/16; H01L 25/18; H01L 27/156
See application file for complete search history.

(56) References Cited

U.S. PATENT DOCUMENTS

| | | | |
|---|---|---|---|
| 2018/0143729 A1* | 5/2018 | Lee | ..................... H01L 51/5253 |
| 2018/0358339 A1 | 12/2018 | Iguchi | |
| 2021/0383744 A1* | 12/2021 | Harada | ................. G09G 3/3266 |
| 2022/0005994 A1* | 1/2022 | Morita | ................. H01L 25/0753 |

OTHER PUBLICATIONS

"Advanced Integration of Devices Enabled by Laser Crystallization of Silicon" Vincent W. Lee, Columbia University, Oct. 11, 2012.
"Wafer-Scale 3D Integration of InGaAs as Image Sensors with Si Readout Circuits." Chen, C.L. et al., IEEE International Conference on 3D System Integration, Sep. 28, 2009. 3DIC 2009. p. 1-4. Institute of Electrical and Electronics Engineers.

* cited by examiner

*Primary Examiner* — Allan R Wilson
(74) *Attorney, Agent, or Firm* — Venable LLP

(57) ABSTRACT

A light-emitting element in which a first member having a light-emitting diode layer formed therein, and a second member having a drive circuit layer formed therein, are stacked and bonded to each other, wherein the light-emitting diode layer and the drive circuit layer are electrically connected by an electrode; the second member includes a light-shielding portion different from the electrode; the light-shielding portion is disposed so as to cover at least part of a first pixel and a second pixel demarcated by an isolation structure provided in the light-emitting diode layer; and a layer that forms the light-emitting diode layer in the first pixel and a layer that forms the light-emitting diode layer in the second pixel are shared.

6 Claims, 7 Drawing Sheets

LIGHT-EMITTING ELEMENT, AND
METHOD FOR PRODUCING A
LIGHT-EMITTING ELEMENT

BACKGROUND OF THE INVENTION

Field of the Invention

The present invention relates to a light-emitting element, and to a method for producing a light-emitting element.

Description of the Related Art

Light emitting devices have been developed that have various compound semiconductors in which gallium nitride (GaN) or the like is utilized. In image display devices such as displays, light-emitting elements that constitute respective individual pixels which form an image, and pixel terminals of drive circuits made up of semiconductor integrated circuits and that are disposed in the form of a matrix, are electrically connected in respective elements.

Herein, Lee, Vincent Wing-Ho, "Advanced Integration of Devices Enabled by Laser Crystallization of Silicon", 2012 discloses an element in which integrated circuits of thin-film transistors (TFT) configured out of amorphous silicon or low-temperature polysilicon (LTPS) are stacked on a compound semiconductor. Light-emitting elements are formed beforehand on a compound semiconductor, and TFT integrated circuits are formed on the light-emitting elements, to thereby configure the drive circuits of pixels. Through supply of a signal from the TFT integrated circuits disposed in the form of a matrix, the light-emitting elements that make up the respective individual pixels are caused to emit light, to elicit image display.

Further, Chen, C. L., "Wafer-Scale 3D Integration of InGaAs Image Sensors with Si Readout Circuits", 2009 discloses an element wherein a silicon semiconductor in which semiconductor integrated circuits are formed and a compound semiconductor in which pixels are formed are bonded to each other, the silicon semiconductor is thinned through polishing from a surface different from that of the semiconductor integrated circuits, and wiring connection is established by way of through-electrodes.

The above document discloses an area sensor that acquires an infrared image, the area sensor being made up of stacked-type photodetector elements and in which photodiodes of a compound semiconductor are formed as respective pixels. The silicon semiconductor is thinned through polishing, to thereby allow forming a through-electrode from the side of the silicon semiconductor, and allow realizing a stacked-type element of a compound semiconductor and a silicon semiconductor. Further, a high-speed operation is enabled through connection of the compound semiconductor diodes and drive circuits of the silicon semiconductor.

SUMMARY OF THE INVENTION

However, Lee 2012 indicates that low-temperature polysilicon (LTPS) requires a laser recrystallization technique, and hence special equipment is necessary to that end. Further, LTPS exhibits crystal defects, at discontinuous planes in crystal grain boundaries, that exert an influence on transistor characteristics; threshold value variability in the transistor is significant as a result, which entails emission variability among pixels. High-speed driving of the image display is moreover limited, on account of low carrier mobility in the amorphous silicon and low-temperature polysilicon.

In a case where the art in Chen 2009 is used as a light-emitting element, light may possibly strike drive circuits (integrated circuits) made up of CMOS transistors, giving rise to malfunction of the drive circuits, and thus a problem arose as a result in that proper emission was difficult.

In view of the above problems, it is an object of the present art to provide a light-emitting element capable of realizing more appropriate emission and high-speed driving.

A first aspect disclosed in the present art is a light-emitting element in which a first member having a light-emitting diode layer formed therein, and a second member having a drive circuit layer formed therein, are stacked and bonded to each other, wherein the light-emitting diode layer and the drive circuit layer are electrically connected by an electrode;

the second member includes a light-shielding portion different from the electrode;

the light-shielding portion is disposed so as to cover at least part of a first pixel and a second pixel demarcated by an isolation structure provided in the light-emitting diode layer; and a layer that forms the light-emitting diode layer in the first pixel and a layer that forms the light-emitting diode layer in the second pixel are shared.

A second aspect disclosed in the present art is a light-emitting element in which a first member having a light-emitting diode layer formed therein, and a second member having a drive circuit layer formed therein, are stacked and bonded to each other, wherein the light-emitting diode layer and the drive circuit layer are electrically connected by an electrode;

the second member includes a light-shielding portion different from the electrode;

the light-emitting diode layer is provided with an isolation structure that demarcates a pixel; and the light-shielding portion is a light-shielding wall running through the drive circuit layer; and the light-shielding wall is disposed so as to overlap the isolation structure in a plan view.

A third aspect disclosed in the present art is a light-emitting element in which a first member having a light-emitting diode layer formed therein, and a second member having a drive circuit layer formed therein, are stacked and bonded to each other, wherein the light-emitting diode layer and the drive circuit layer are electrically connected by an electrode;

the second member includes a light-shielding portion different from the electrode;

a plurality of pixels are formed in the first member;

an opening arranged in a stacking direction with respect to the pixels in the first member is formed in the second member; and the light-shielding portion is a layer that covers an inner wall of the opening.

A fourth aspect disclosed in the present art is a method for producing a light-emitting element, the method including the steps of:

preparing a first member in which a light-emitting diode layer is formed;

preparing a second member in which a drive circuit layer is formed;

forming, in the second member, a light-shielding portion that covers at least part of a pixel demarcated by an isolation structure provided in the light-emitting diode layer;

bonding the first member and the second member; and forming an electrode which is electrically connected to the light-emitting diode layer, and which runs through the drive circuit layer.

A fifth aspect disclosed in the present art is a method for producing a light-emitting element, the method including the steps of:

preparing a first member which is made up of a plurality of pixels and which has, in a light-emitting diode layer, a first conductivity type region and a second conductivity type region;

preparing a second member in which a drive circuit layer is formed;

bonding the first member and the second member;

forming a light-shielding portion running through the drive circuit layer;

forming an electrode which electrically connects the second conductivity type region to the drive circuit layer, on a pixel-by-pixel basis; and forming an electrode which electrically connects in a common manner the first conductivity type region, in the plurality of pixels.

A sixth aspect disclosed in the present art is a method for producing a light-emitting element, the method including the steps of:

preparing a first member which is made up of a plurality of pixels and which has, in a light-emitting diode layer, a first conductivity type region and a second conductivity type region;

preparing a second member in which a drive circuit layer is formed;

bonding the first member and the second member;

forming an opening in the second member, in a stacking direction with respect to the pixels of the first member;

forming an electrode which electrically connects the second conductivity type region to the drive circuit layer, on a pixel-by-pixel basis;

forming an electrode which electrically connects in a common manner the first conductivity type region, in the plurality of pixels; and forming a light-shielding portion that covers an inner wall of the opening.

Further features of the present invention will become apparent from the following description of exemplary embodiments with reference to the attached drawings.

DESCRIPTION OF THE EMBODIMENTS

Problems of Prior Art

Figure 7:
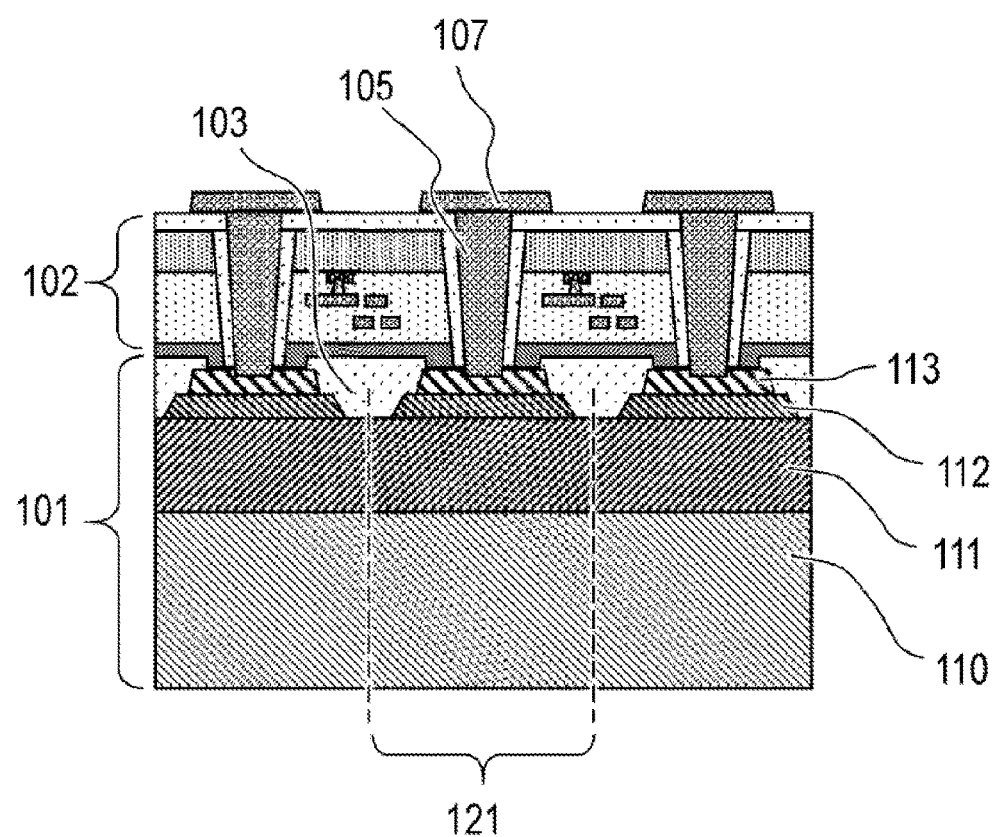
FIG. 7 is a cross-sectional diagram illustrating an image display device according to the prior art.

A detailed explanation follows first, with reference to FIG. 7, on the problems derived from using the photodetector element according to Chen 2009, which is prior art, as a light-emitting element. A photodiode having a compound semiconductor used in the prior art and the light-emitting diode used in the present embodiment share a basic structure, although with numerous portions that differ in design, for instance in terms of the thickness of respective layers and carrier concentration.

Configuration of Photodetector Element According to Prior Art

The configuration of a photodetector element according to the prior art will be explained first with reference to the cross-sectional diagram illustrated in FIG. 7. The element according to the prior art has a first member 101 and a second member 102.

In the first member 101, element isolation grooves 103 are formed in order to configure pixels 121, and an active layer 112 and a second conductive layer 113 are isolated for each pixel by the element isolation grooves 103. Pixels are demarcated herein by the element isolation grooves 103, but the respective pixels may be demarcated by some other isolation structure, such as PN isolation. The active layer 112 is sandwiched between a first conductive layer 111 and the second conductive layer 113. The first member 101 operates as a photodiode, as a result of application of voltage across the first conductive layer 111 and the second conductive layer 113. The first conductive layer 111 is connected to one voltage supply via a common electrode (not shown).

Integrated circuits having CMOS transistors configured therein are formed in the second member 102. In order to form a photodetector element having such a first member 101 and second member 102, the first member 101 having diodes formed therein and a second member 102 having integrated circuits formed therein are first bonded. Through-electrodes 105 that connect the second conductive layer 113 of the diodes that make up the pixels of the first member 101 and the second member 102 are formed after bonding. A metal layer 107 connects contact electrodes (not shown) that are connected to CMOS transistors (not shown), and the through-electrodes 105. As a result, voltage can be applied individually from respective CMOS transistors to the pixels, via the metal layer 107 and the through-electrodes 105, and thus a stacked-type photodetector element is realized as a result.

Problems of Elements According to Prior Art

Problems of an image display device that is configured by replacing diodes of pixels by light-emitting diodes, in order to use a photodetector element as a light-emitting element, will be addressed next.

A light-emitting diode made up of a compound semiconductor is for instance configured out of a compound semiconductor substrate 110 such as InP, the first conductive layer 111, the active layer 112 such as such InGaAs, and the second conductive layer 113. On the output side of light from the active layer 112 there is disposed an InP substrate which is the compound semiconductor substrate 110, such thus light emitted by the active layer 112 is outputted by passing through the compound semiconductor substrate 110. The light emitted by the active layer 112 is outputted omnidirectionally, and hence light is also outputted towards the second member 102 on the reverse side from that of the compound semiconductor substrate 110.

Since drive circuits (integrated circuits) configured out of CMOS transistors are formed in the second member 102, a problem arises as a result in that the drive circuits malfunction when struck with light.

Preferred embodiments of the present invention aimed at solving such a problem will be explained below with reference to accompanying drawings. The present invention is however not limited to the concrete embodiments, and can accommodate various modifications without departing from the scope of the invention.

Embodiment 1

Cross-Sectional Configuration of Image Display Device

The cross-sectional configuration of a stacked-type image display device (light-emitting element) according to Embodiment 1 will be explained next with reference to the cross-sectional diagram of the image display device illustrated in FIG. 1. The image display device has a first member 101 and a second member 102. The first member 101 will be explained hereafter by referring to the direction in which the second member 102 is positioned as "up(ward)". Therefore, the stacking direction of the two members is herein a vertical direction.

The semiconductor stack structure (light-emitting diode layers) of the light-emitting diodes that makes up the first member 101 has the compound semiconductor substrate 110 such as InP, the first conductive layer 111, the active layer 112 formed out of InGaAs or the like, and the second conductive layer 113. The first conductive layer 111 and the second conductive layer 113 are regions (conductivity type regions) of different conductivity type. The first member 101 is isolated into a plurality of light-emitting pixels 121 (emission regions 120) by element isolation grooves 103 (isolation structure). The first conductive layer 111 is shared by all the pixels (plurality of pixels).

The CMOS drive circuits (drive circuit layers) that make up the second member 102 includes a silicon substrate 116 on which a CMOS transistor is formed, and a wiring layer 115 having a conductive member that makes up wiring 108a, and drives the light-emitting pixels 121. A gate electrode of a pixel driving transistor is formed in the CMOS pixel circuit (drive circuit layer). The first member 101 having a light-emitting diode formed therein is disposed below the wiring layer 115.

The first member 101 and the second member 102 are bonded to each other at a bonding surface 114. The second conductive layer 113 of the first member 101 is electrically connected to the second member 102 by the through-electrodes 105 that run through the drive circuit layer for each light-emitting pixel 121. A common electrode 109 is electrically connected in common to the plurality of light-emitting pixels 121.

The second member 102 has a configuration wherein malfunction of the drive circuits derived from light generated by the light-emitting diode layer is unlikelier to occur by virtue of the fact that the second member 102 includes a light-shielding layer (light-shielding portion). In the present embodiment an instance is illustrated in which wiring 108b included in the wiring layer 115 and being formed between the wiring 108a included in the wiring layer 115 and the first member 101, is used as a light-shielding layer. However, the wiring 108a included in the wiring layer 115, and other wiring not shown, may likewise be used as a light-shielding layer. The through-electrodes 105 as well can shield light, but will not be referred to as a light-shielding layer (light-shielding portion) in the present embodiment.

Any metallic material from among at least aluminum, titanium and a titanium alloy, copper and the like can be used in the wiring 108a and the wiring 108b. These metallic materials are non-transmissive towards light over a wide range from the visible region to the infrared region. Thus the wiring 108a and wiring 108b, which can be formed in a step of forming the wiring layer 115, serve as a light-shielding layer. It is accordingly not necessary to add a new step in a production process of the image display device, in order to form a light-shielding layer. In the present embodiment the wiring 108a is electrically connected to the second member 102 (light-emitting diode layer), whereas the wiring 108b is not electrically connected to the second member 102 (light-emitting diode layer). The wiring 108a is electrically connected to the second member 102 by being electrically connected to the through-electrodes 105, the contact electrodes 106 and the metal layer 107. However, the wiring 108b may be configured in the form of wiring electrically connected to the second member 102 (light-emitting diode layer). The wiring 108b is formed so as to cover the entirety of the second member 102 side of the light-emitting pixels 121, in order to block light effectively. That is, a configuration may be adopted wherein part of the wiring 108b and the entirety of the light-emitting pixels 121 overlap, in a plan view (see-through view from above). The wiring 108b need not necessarily cover the entirety of the second member 102 side (second member side) of the light-emitting pixels 121, and the effect according to the present embodiment can be achieved so long as at least part of the second member 102 side (second member side) of the light-emitting pixels 121 is covered. For instance, the wiring 108b covers at least part of the second member 102 side (second member side) of the plurality of light-emitting pixels 121.

The image display device according to the present embodiment has a structure in which emitted light is extracted from a surface (opposing surface) of the first member 101, the surface being opposite to the surface at which the first member is bonded to the second member 102. That is, the image display device functions as a back emission-type light-emitting element. Accordingly, an air cooling device or an electronic cooling device such as a Peltier element can be attached to the top surface of the second member 102. An optical adjustment layer such as an anti-reflection film or a color filter can be formed on a surface (lower surface) of the first member 101 from which light is extracted. A wavelength conversion material can be inserted at the surface of the first member 101 from which light is extracted.

Planar Configuration of Image Display Device

The planar configuration of the image display device according to Embodiment 1 will be explained next with reference to a plan-view diagram (see-through diagram) of the image display device illustrated in FIG. 2. FIG. 2 illustrates the image display device according to Embodiment 1 in a see-through view (in a plan view) from above. FIG. 2 illustrates four light-emitting pixels 121 disposed in the form of a matrix (in the form of an array) of two rows by two columns. The same reference symbols are used in FIG. 2 for features identical to those in FIG. 1.

For instance a reset transistor 505, an amplification transistor 506 and a selection transistor 507 are formed as transistors (MOS transistors) for driving the light-emitting pixels 121, in the image display device illustrated in FIG. 2. Various semiconductor regions such as a source region and a drain region of each transistor for driving in the light-emitting pixels 121 are formed in the second member 102.

The wiring 108*a* that transmits a driving signal is formed on each light-emitting pixel 121. The wiring 108*a* includes a reset line 501, a power line 502, a select line 503, and an input line 504.

A signal outputted from the reset line 501 drives the reset transistor 505. Upon driving of the selection transistor 507 by the signal outputted from the select line 503, a signal outputted from the input line 504 is amplified by the amplification transistor 506, and is outputted to the second conductive layer 113 for instance via the contact electrodes 106. Wiring that links the reset transistor 505 and the amplification transistor 506 is connected to the contact electrodes 106.

Through-electrodes 105 are connected to the second conductive layer 113 at each light-emitting pixel 121. In the second conductive layer 113, element isolation grooves 103 that configure an annular structure are provided inward of the light-emitting pixels 121 so as to avoid, in a plan view, the portion at which the wiring 108*a* is formed. The contact electrodes 106 and the through-electrodes 105 are connected by the metal layer 107 that straddles the element isolation grooves 103, in a plan view.

By virtue of the above configuration, an electrical signal from the amplification transistor 506 can be applied to the light-emitting pixels 121 (light-emitting diode layer) that make up the light-emitting diodes. The amplification transistor 506 amplifies the signal inputted from the input line 504, and applies the amplified signal to the light-emitting diode layer, in accordance with the magnitude of the electrical signal. In the present embodiment the wiring 108*b* that shields emission by the light-emitting diode layer is formed below the wiring 108*a*, so that such transistors can be driven normally.

Method for Producing Image Display Device

Figure 3:
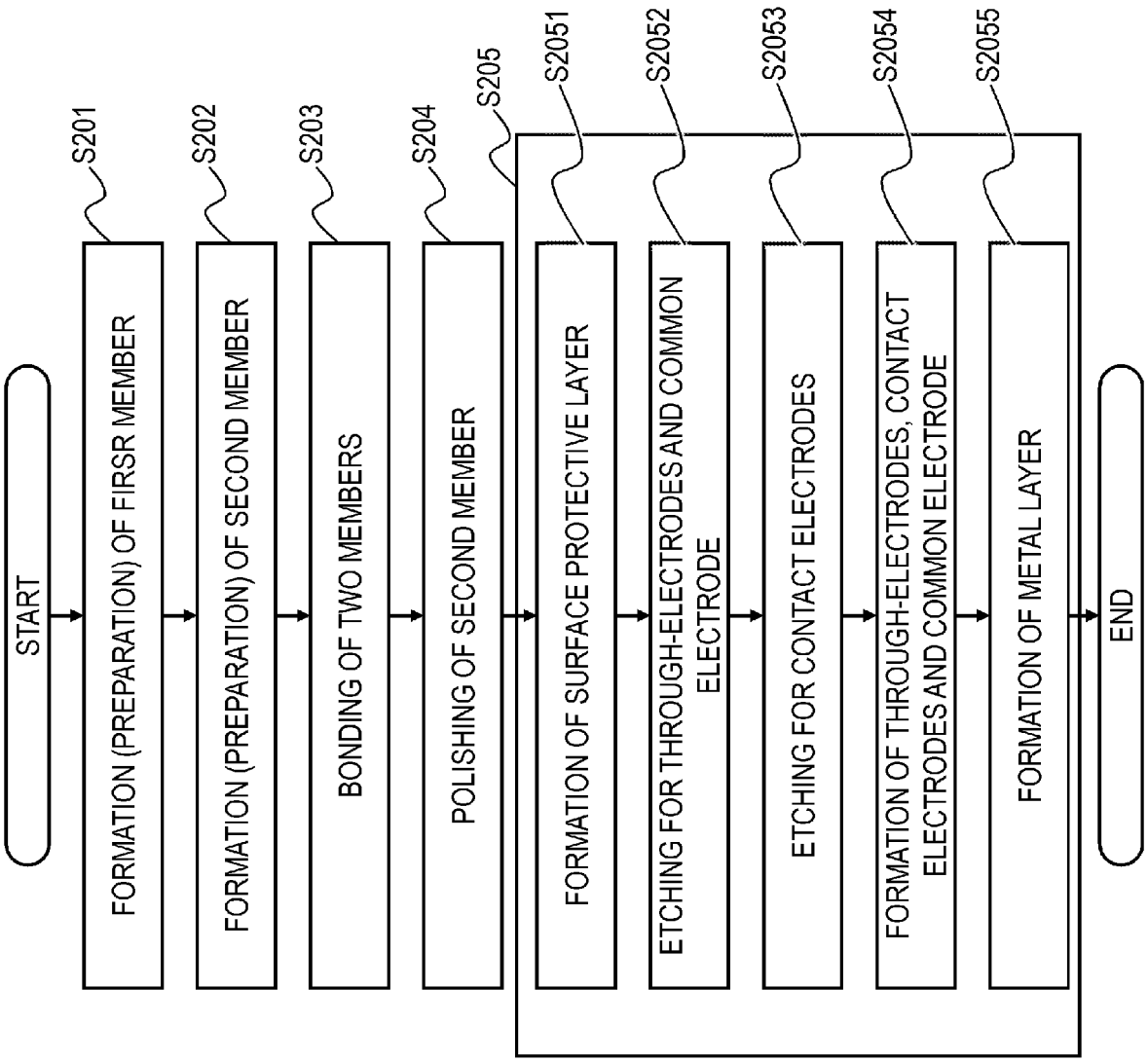
FIG. 3 is a flowchart illustrating a method for producing an image display device according to Embodiment 1.

An example of a method for producing the image display device illustrated in FIG. 1 will be explained with reference to the flowchart illustrated in FIG. 3 and the cross-sectional diagrams illustrated in FIG. 1, FIG. 4A and FIG. 4B.

S201

In S201 there is formed the first member 101. The first member 101 need not be necessarily formed in this step, and a first member 101 formed beforehand may be prepared herein.

In the present embodiment, the first conductive layer 111 which is an n-type InP buffer layer, the active layer 112 which is an InGaAs light-receiving layer and the second conductive layer 113 which is an InP window layer are sequentially grown epitaxially on a compound semiconductor substrate 110 which is a 4-inch InP substrate. The In and Ga composition of the InGaAs light-receiving layer is lattice-matched to that of the InP substrate.

In order to form the element isolation grooves 103 and the common electrode groove 104, part of the first conductive layer 111, the active layer 112 and the second conductive layer 113 are isolated next by dry etching or wet etching. Etching damage of the side wall of the etched portion is removed.

Thereafter the etched portion is filled by an insulator made up of silicon nitride SiN, silicon oxide SiO or the like, for instance formed by plasma CVD, whereupon the element isolation grooves 103 and the common electrode groove 104 become formed as a result. The light-emitting pixels 121 are isolated through formation of respective element isolation grooves 103. The first member 101 of S201 becomes formed as a result of this step.

S202

In S202 there is formed the second member 102 having the silicon substrate 116 and the wiring layer 115. Specifically a MOS transistor is formed on the surface of the silicon substrate 116 which is a 4-inch silicon substrate, and a CMOS pixel circuit, to which the MOS transistor is wired, is configured in the wiring layer 115. The silicon substrate 116 is for instance of crystalline silicon. In the present embodiment, the wiring 108*a*, and the wiring 108*b* which is a light-shielding layer, are formed in S202. The second member 102 need not necessarily be formed in the present step, and a second member 102 formed beforehand may be prepared herein. Alternately, there may be prepared a second member 102 not having the wiring 108*a*, 108*b* formed therein, the wiring 108*a*, 108*b* being then formed in the second member 102 in S202.

S203

Figure 4:
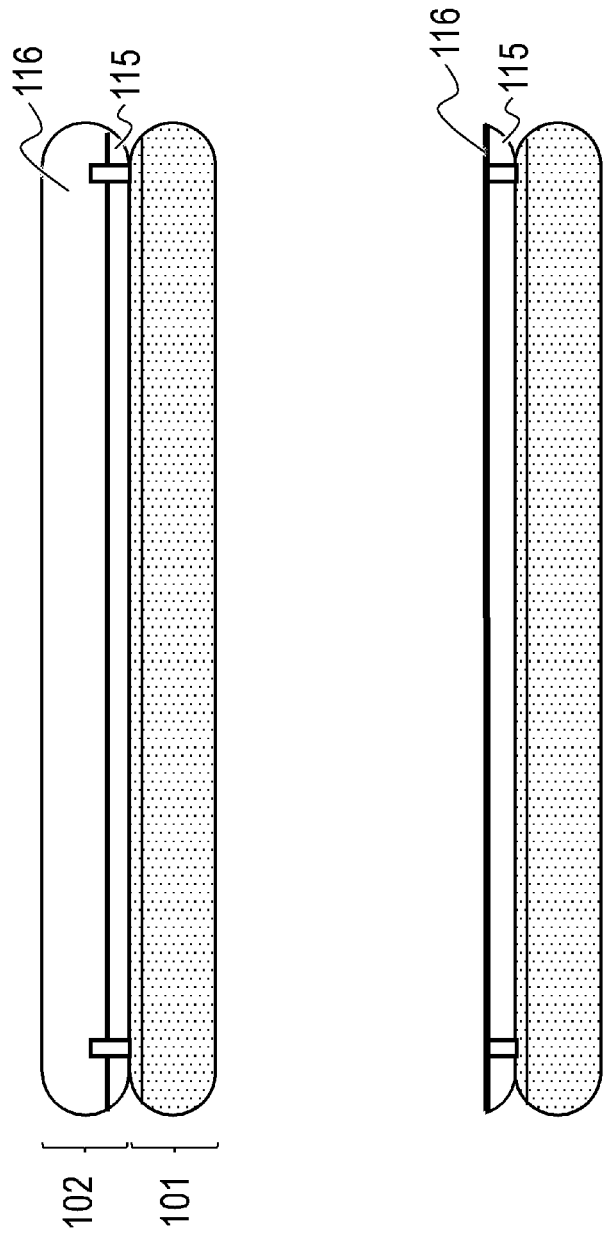
FIG. 4A and FIG. 4B are cross-sectional schematic diagrams for explaining a production process of the image display device according to Embodiment 1.

In S203 the first member 101 and the second member 102 are bonded as illustrated in FIG. 4A. In more detail, the wiring layer 115 in the second member 102 and the second conductive layer 113 in the first member 101 are disposed opposing each other, and the members are bonded to each other. In the present embodiment adhesive bonding utilizing an adhesive is resorted to for member bonding, but for instance also plasma activated bonding via an oxide film surface and diffusion bonding via a thin metal layer are also suitable. In the present embodiment, therefore, the bonding surface 114 made up of an adhesive is formed through bonding of the members.

S204

In S204 the silicon substrate 116 of the second member 102 is polished thinly in a state where the first member 101 and the second member 102 are bonded to each other, as illustrated in FIG. 4B. In more detail, the second member 102 is polished by a back grinding device, to reduce the thickness of the member down to 10 µm. Thereafter, a CMP polishing device removes cutting scratches in the second member 102 caused by the back grinding device.

The in-plane uniformity of the member thickness of the second member 102 can be improved by virtue of the fact that the silicon substrate 116 is made up of a plurality of materials with different selection ratios. In a case for instance where a SOI substrate is used in which a silicon oxide film is inserted between a silicon substrate and another silicon substrate, the selection dry etching process ratio of silicon in the silicon oxide film in a is high, of about 10. Accordingly, the silicon oxide film is effective as an etching stop layer. Alternately a method can be resorted to in which a silicon substrates having large differences in impurity concentration are used, and a mixed solution of hydrogen fluoride, nitric acid and acetic acid, being a chemical solution having different etching rates for p-type silicon and n-type silicon is utilized, to thereby allow achieving the thickness of a member having a high in-plane uniformity.

S205

Figure 1:
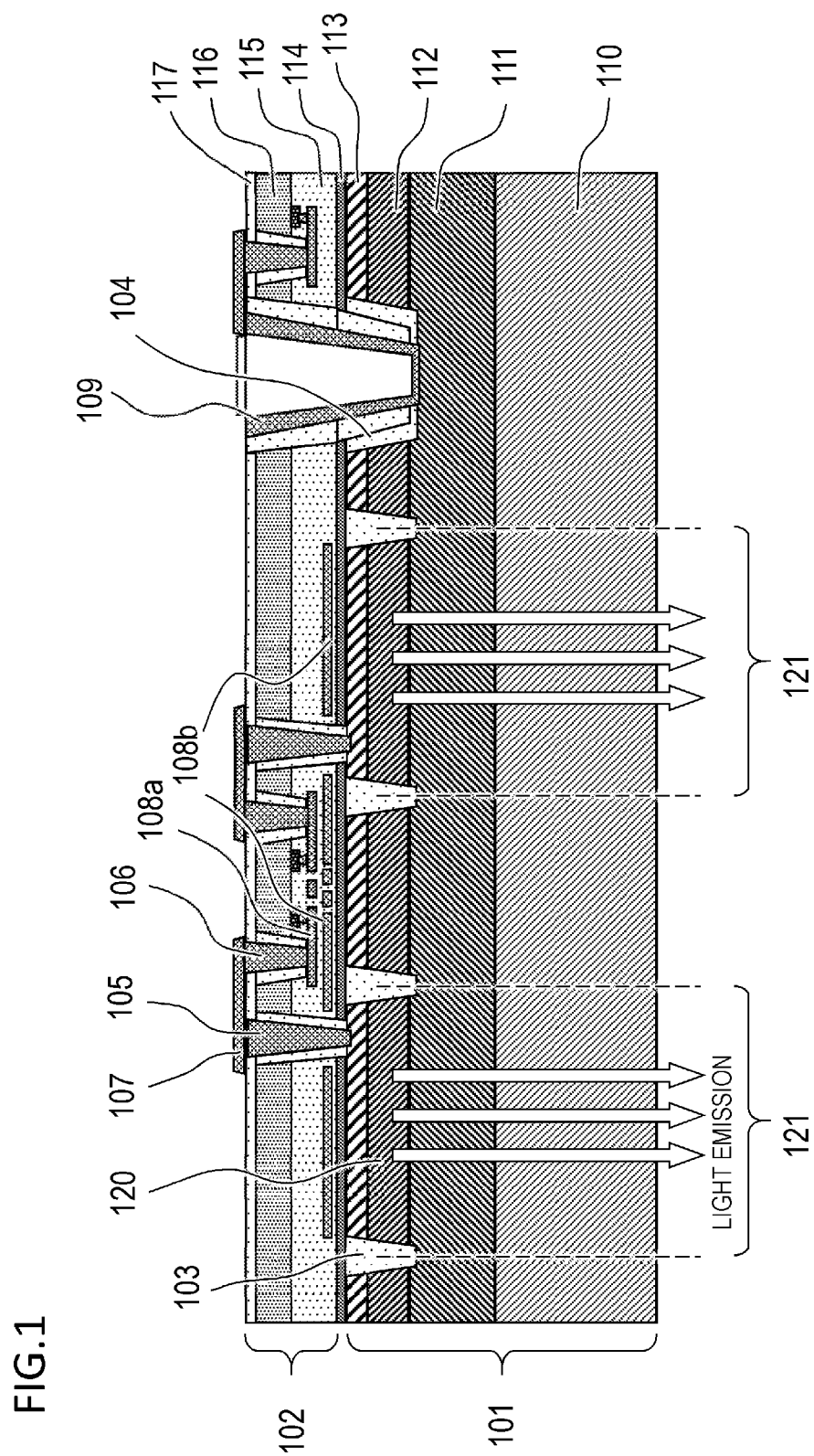
FIG. 1 is a cross-sectional diagram illustrating an image display device according to Embodiment 1.
Figure 2:
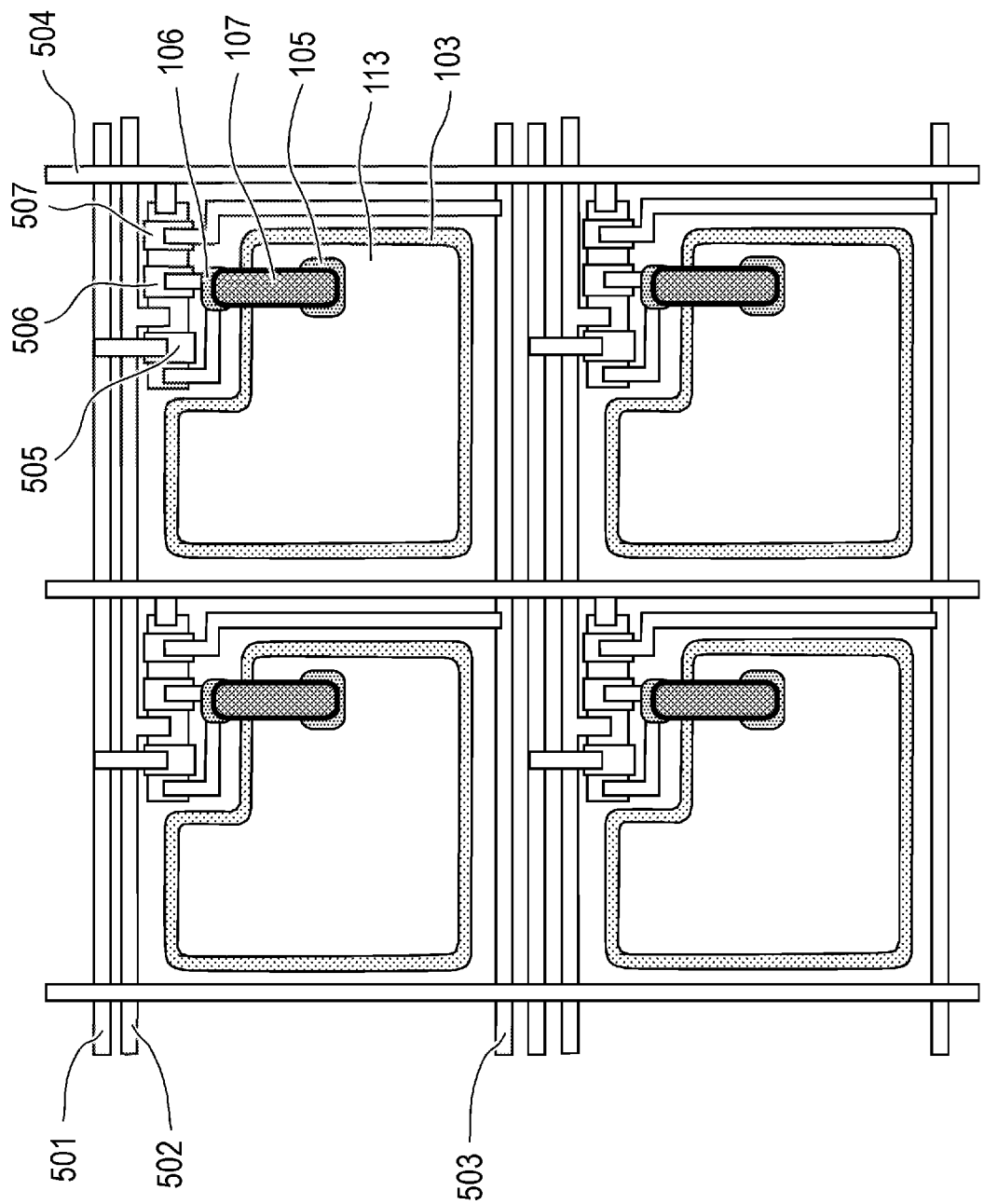
FIG. 2 is a plan-view diagram illustrating the image display device according to Embodiment 1.

In S205, as illustrated in FIG. 1, a surface protective layer 117 is formed on the thinly polished surface of the second member 102, the through-electrodes 105 are formed, and thereafter the metal layer 107 is formed. The process in S205 will be explained in detail divided into S2051 to S2055.

S2051

Firstly, the surface protective layer 117 is formed out of a silicon oxide film or a silicon nitride film, on the polished surface of the silicon substrate 116 of the second member 102.

S2052

Next, the silicon substrate 116 and the wiring layer 115 are dry-etched in order to form the through-electrodes 105 and the common electrode 109. In the through-electrodes 105, an adhesive on the bonding surface 114 is further etched, and etching is stopped as appropriate once the second conductive layer 113 of the first member 101 is exposed. In the common electrode 109, the adhesive on the bonding surface 114 and the insulator in the common electrode groove 104 are further dry-etched, and etching is stopped as appropriate once the first conductive layer 111 of the first member 101 is exposed.

S2053

In order to form the contact electrodes 106, holes (openings) are formed through dry-etching of the silicon substrate 116 and the wiring layer 115, and etching is stopped at the wiring 108a in the wiring layer 115.

S2054

In order to form the through-electrodes 105, the contact electrodes 106, and the common electrode 109, the etched portion is filled up, for instance by sputtering or plating, with a metal made up of aluminum, titanium, a titanium compound (titanium alloy), tantalum, copper or the like. The through-electrodes 105, contact electrodes 106 and common electrode 109 are formed as a result of the above filling. The through-electrodes 105 and the second conductive layer 113 become electrically connected, the common electrode 109 and the first conductive layer 111 become electrically connected, and the contact electrodes 106 and the wiring 108a become electrically connected at this time.

S2055

The metal layer 107 is formed last. The through-electrodes 105 and the contact electrodes 106 are electrically connected, and the contact electrodes 106 and the common electrode 109 are electrically connected, by the metal layer 107. A protective layer by an insulating film may be formed thereafter in order to prevent corrosion of the metal layer 107. The image display device illustrated in FIG. 1 is thus produced as a result of the steps above.

In Embodiment 1, the possibility that light emitted by the first member 101 be incident on the second member 102 is curtailed by the wiring 108b which is a light-shielding layer. Accordingly, the influence of light on the operation of the drive circuits of the second member 102 can be suppressed, and the image display device can emit light more properly. In the present embodiment, compound semiconductor diodes and drive circuits of a silicon semiconductor are respectively connected to one another, and accordingly it becomes possible to achieve, at the same time, high-speed driving of the image display device (light-emitting element).

Embodiment 2

Figure 5:
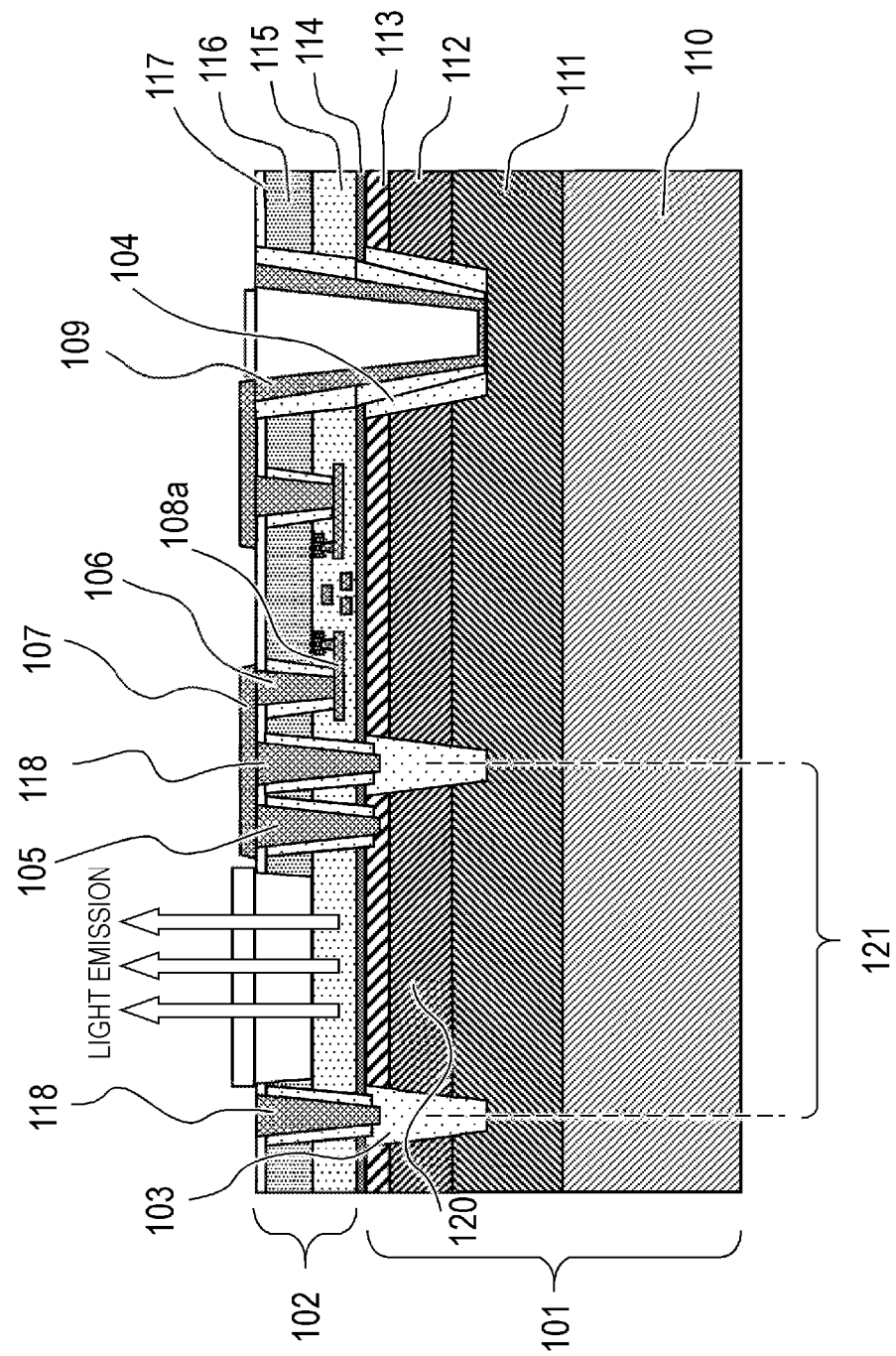
FIG. 5 is a cross-sectional diagram illustrating an image display device according to Embodiment 2.

An image display device (light-emitting element) according to Embodiment 2 will be explained with reference to the cross-sectional diagram illustrated in FIG. 5. Features similar to those of Embodiment 1 will not be explained again. The image display device according to the present embodiment differs from Embodiment 1 in the respects below.

The image display device according to the present embodiment has a structure in which the second member 102 has a light transmitting property, and the light emitted from the surface of the first member 101 bonded to the second member 102 is extracted via the second member 102. The light transmitting property is a property whereby an object lets light through; thus an object that lets through light of at least any wavelength, such as infrared light, visible light or ultraviolet light, is deemed to have the light transmitting property. Transmission of light is not limited herein to all incident light being necessarily transmitted, and encompasses for instance transmittance of light of stronger intensity than a predetermined proportion, in the intensity of incident light. A light-shielding portion (light-shielding wall) running through the second member 102 in the stacking direction is provided in the image display device according to the present embodiment. The light-shielding wall 118 is provided at the top (stacking direction; inside) of the element isolation grooves 103. Thus the light-shielding wall 118 and the element isolation grooves 103 overlap in a plan view. The light-shielding wall 118 shields blocks light from the light-emitting diode layer, in a horizontal direction, to the drive circuit layer. As a result, malfunction of the drive circuits can be suppressed as compared with an instance where the light-shielding wall 118 is not provided, and hence an effect similar to that of Embodiment 1 can be achieved.

Ordinarily various devices and elements are mounted at the bottom of the first member 101, and accordingly light generated by the active layer 112 is not outputted to the exterior the image display device via the first member 101. Hence, light from the light-emitting diode layer can be extracted effectively from the second member 102.

In the present embodiment light generated in the emission regions 120 passes through the wiring layer 115 and the bonding surface 114 of the second member 102.

The wiring layer 115 is formed as an interlayer insulating film. The wiring layer 115 may be formed of a material that transmits light in a wide range from visible light to the infrared region, mainly silicon nitride SiN, silicon oxide SiO or the like.

The bonding surface 114 may be an adhesive in a case for instance where bonding of members is adhesive bonding. The bonding surface 114 can be a thin oxide film in the case of plasma activated bonding, and can be an ultrathin metal in the case of diffusion bonding. The bonding surface 114 may be formed out of a light-transmitting material, within a wide range from visible light to the infrared light region.

Method for Producing Image Display Device

Steps S201 to S2051 similar to those of Embodiment 1 are carried out in order to produce the image display device according to the present embodiment. In S202 no wiring 108b is formed.

The light-shielding wall 118 is further formed as a result of a step similar to that of formation of the through-electrodes 105, at the time of formation of the through-electrodes 105, the contact electrodes 106 and the common electrode 109 in S2052 to S2054. The light-shielding wall 118 can be configured out of at least any metal such as aluminum, titanium, a titanium compound, tantalum or copper.

The through-electrodes 105 and the contact electrodes 106 are electrically connected, or the contact electrodes 106 and the common electrode 109 are electrically connected, through formation of the metal layer 107 in S2055. Thereafter the surface protective layer 117 and the silicon substrate 116 are removed by dry-etching, while leaving the wiring layer 115 at the top (light-emitting pixels 121) of the emission regions 120; as a result an opening is formed in the second member 102, and the image display device illustrated in FIG. 5 is completed thereby.

Embodiment 3

Figure 6:
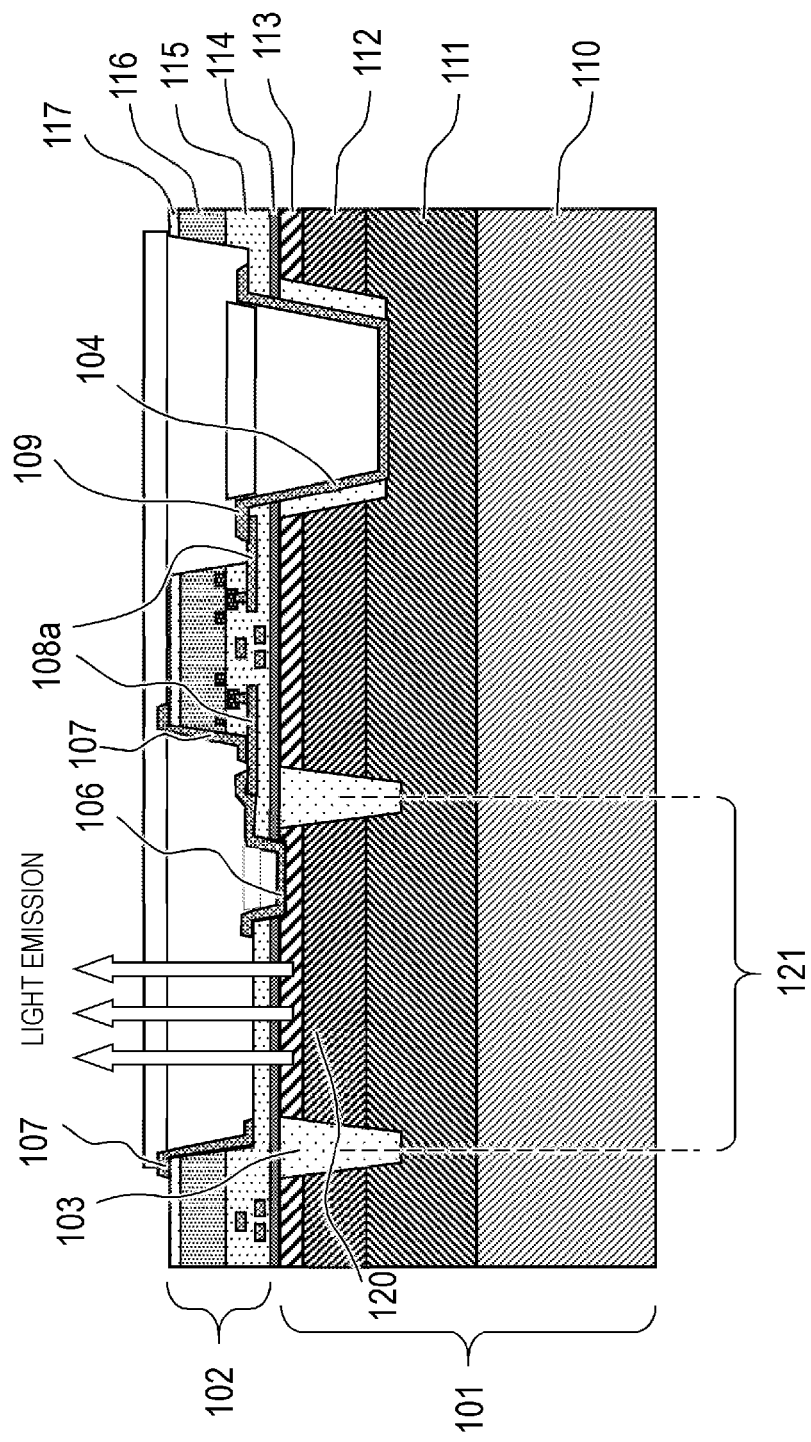
FIG. 6 is a cross-sectional diagram illustrating an image display device according to Embodiment 3.

An image display device (light-emitting element) according to Embodiment 3 will be explained next with reference to the cross-sectional diagram illustrated in FIG. 6. Features similar to those of the Embodiment 2 will not be explained again. The image display device according to the present embodiment differs from Embodiment 2 in the respects below.

In Embodiment 2 the wiring 108a and the second conductive layer 113 are connected, for each light-emitting pixel 121, by the through-electrodes 105, the metal layer 107 and the contact electrodes 106. In the present embodiment the wiring 108a and the second conductive layer 113 are connected by the contact electrodes 106 alone. The metal layer 107, instead of the light-shielding wall 118 of the Embodiment 2, is light-shielding herein. In more detail, a metal layer 107 is formed so as to cover the inner wall of the opening of the second member 102 and the top (stacking direction) of the light-emitting pixels 121. As a result an effect similar to that of Embodiment 2 can be achieved and, in addition, the image display device is easier to form than in Embodiment 2, and the image display device can be realized in a simple process.

Method for Producing Image Display Device

A method for producing an image display device according to the present embodiment involves executing first the process in S201 to S204, similarly to Embodiment 1.

In S205 next, the surface protective layer 117 and the silicon substrate 116 above the emission regions 120 and the common electrode groove 104 are removed by dry etching, with further removal up to part of the wiring layer 115. Etching is stopped as appropriate once the wiring 108a is exposed.

Thereafter, the wiring layer 115 and the bonding surface 114 are dry-etched in the vicinity (stacking direction) of the emission regions 120, so that holes (openings) for forming the contact electrodes 106 are formed as a result. Etching is stopped as appropriate once the second conductive layer 113 is exposed. A hole for forming the common electrode 109 is formed, in the vicinity of the common electrode groove 104, through dry etching of the wiring layer 115, the bonding surface 114 and the insulator of the common electrode groove 104. Etching is stopped as appropriate once the first conductive layer 111 is exposed.

The second conductive layer 113 and the wiring 108a become electrically connected, at each light-emitting pixel 121, through formation of respective contact electrodes 106. The first conductive layer 111 and the wiring 108a become electrically connected through formation of the common electrode 109. The metal layer 107 that surrounds the periphery of each emission region 120 in a plan view is formed as a light-shielding portion. The metal layer 107 can be made up of a metal composed of at least any from among aluminum, titanium, a titanium compound, tantalum, copper or the like. The metal layer 107 may make up the contact electrodes 106 and the common electrode 109. A protective layer by an insulating film may be formed for the purpose of preventing corrosion of the metal layer 107 and imparting anti-reflection properties. The image display device illustrated in FIG. 6 is thus produced as a result of the steps above.

Such being the case, the above light-emitting element allows realizing more appropriate light emission and high-speed driving.

OTHER EMBODIMENTS

The features and processing in the embodiments of the present invention explained above can be utilized by being combined with each other in arbitrary ways.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-112140, filed on Jun. 17, 2019, which is hereby incorporated by reference herein in its entirety.

What is claimed is:

1. A light-emitting element in which a first member having a light-emitting diode layer formed therein, and a second member having a drive circuit layer formed therein, are stacked and bonded to each other,
    wherein the light-emitting diode layer and the drive circuit layer are electrically connected by an electrode;
    the second member includes a light-shielding portion different from the electrode;
    the light-shielding portion is disposed so as to cover at least part of a first pixel and a second pixel demarcated by an isolation structure provided in the light-emitting diode layer; and
    a layer that forms the light-emitting diode layer in the first pixel and a layer that forms the light-emitting diode layer in the second pixel are shared.

2. The light-emitting element of claim 1, wherein the light-shielding portion is a first wiring included in the drive circuit layer.

3. The light-emitting element of claim 2,
    wherein the light-shielding portion is formed between a second wiring included in the drive circuit layer and the first member; and
    the second wiring is electrically connected to the electrode.

4. The light-emitting element of claim 2, having a structure for extracting light emitted from a surface of the first member, the surface opposing a surface at which the first member is bonded to the second member.

5. The light-emitting element of claim 1, wherein the light-shielding portion is formed of at least any from among aluminum, titanium, a titanium alloy and copper.

6. The light-emitting element of claim 1,
    wherein the first member has a first conductivity type region and a second conductivity type region;
    a plurality of pixels are formed in the first member;
    the first conductivity type region is electrically connected in common in the plurality of pixels, to a first electrode; and
    the second conductivity type region is electrically connected, by a second electrode, to the drive circuit layer which drives the pixels, on a pixel-by-pixel basis.

* * * * *